United States Patent [19]

Thompson et al.

[11] 4,295,097

[45] Oct. 13, 1981

[54] BATTERY CAPACITY MEASURING METHOD AND APPARATUS

[75] Inventors: Arthur H. Thompson, 14 Princeton Dr., New Providence, N.J. 07974; Ricardo H. Ballester, Jamaica Estates, N.Y.

[73] Assignee: Arthur H. Thompson, New Providence, N.J.

[21] Appl. No.: 36,412

[22] Filed: May 7, 1979

[51] Int. Cl.³ .............................................. H02J 7/00
[52] U.S. Cl. ..................................... 324/429; 324/426
[58] Field of Search ............... 324/426, 427, 429, 430, 324/432, 433, 434, 435; 320/40, 48; 328/132, 151

[56] References Cited

U.S. PATENT DOCUMENTS

| | | | |
|---|---|---|---|
| 3,593,099 | 7/1971 | Scholl | 324/429 |
| 3,778,702 | 12/1973 | Finger | 320/48 |
| 3,898,548 | 8/1975 | Perelle et al. | 324/428 |
| 4,118,661 | 10/1978 | Siekierski et al. | 320/48 |

*Primary Examiner*—David K. Moore
*Attorney, Agent, or Firm*—Albert P. Halluin

[57] ABSTRACT

A method for measuring the capacity of an electrochemical cell involving the sequential stepping of the voltage applied to the cell and measurement of the accumulated charge. On each voltage step the time dependence of the current passing through the cell is monitored and a step to a new voltage level is made when the current reaches a small but finite value $I_{minimum}$, indicating a given level of charges has been attained. The values of the voltage and charge measured at the current level $I_{minimum}$ may be arbitrarily close to the thermodynamically determined values. Additionally, the time dependent current may be measured while the cell voltage is maintained constant to obtain the kinetic behavior of the battery. Thermodynamically and kinetically related parameters are useful for the performance characterization of electrochemical cells. Devices for implementing the instant method are disclosed where the electrochemical cell is automatically discharged and/or charged while measuring the cell voltage, instantaneous current, accumulated charge and time. The charging and discharging operations are controlled by digital logic circuitry or by a digital computer.

16 Claims, 10 Drawing Figures

LOGIC CIRCUITRY OF BATTERY CYCLER

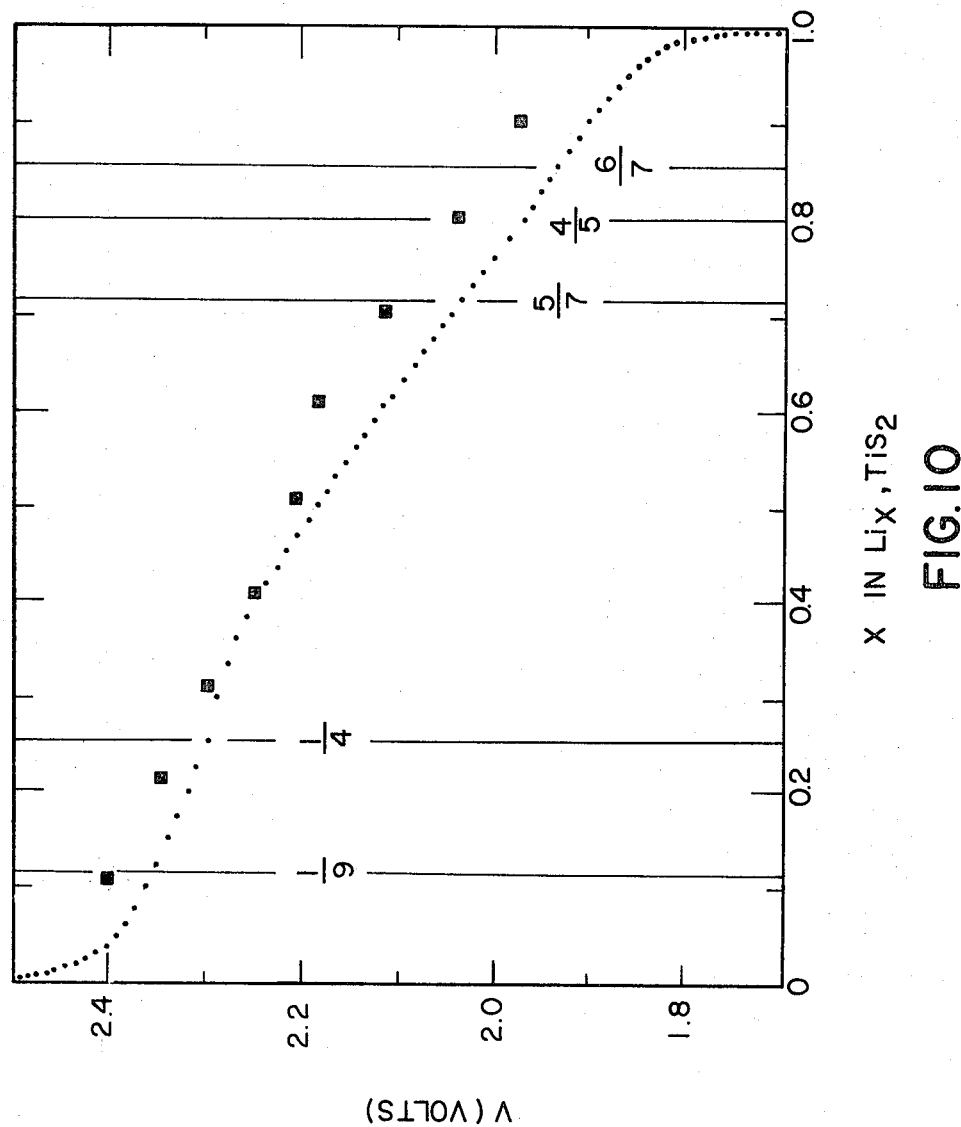

BATTERY CAPACITY MEASURING METHOD AND APPARATUS

BACKGROUND OF THE INVENTION

The present invention relates to a method and devices that are useful for the performance testing of electrochemical cells.

Many potential uses for packaged power exceed the capacity of existing electrochemical cells, and much effort has been recently directed to the development of high energy density electrochemical cells. The ideal electrochemical cell would be one that could take full advantage of the differences in the electrochemical potentials between the highly electropositive alkali metals, particularly lithium, and the highly electronegative halides, particularly fluorine. The reactive nature of both the alkali metals and the halides make the use of these substances in electrochemical cells very difficult. The problems have caused much attention to be focused on the selection and preparation of cathode active materials and alkali ion conducting electrolytes that can be used in conjunction with alkali metal anodes.

The search for new battery systems is normally a time consuming endeavor. New electrochemical cells are typically tested under conditions appropriate for known systems and are charged and discharged many times to test reversibility. Such experiments may require weeks or months of cycling before definitive data are obtained. There is then considerable incentive to develop additional testing procedures that will complement the existing techniques and will reduce the time required to make decisions about the usefulness of new battery couples. Additionally, novel testing procedures can be useful in the analysis of performance criteria for existing commercially available battery systems.

DESCRIPTION OF THE PRIOR ART

The various techniques for measuring electrochemical cell processes have been reviewed on numerous occasions. Two reviews particularly useful for comparison with the methods of the present invention are: E. R. Yeager and J. Kuta, "Techniques for the Study of Electrode Processes", Physical Chemistry, An Advanced Treatise, ed. H. Eyring (Academic Press, N.Y., 1970), p.345 and E. Gileadi, E. Kirowa-Eisner and J. Penciner, Interfacial Electrochemistry, (Addison-Wesley Publishing Co., Reading, MA, (1975). When direct current (dc) techniques are used the cell potential, current, charge, temperature and time may be measured and the parameters selected for study will depend on the peculiarities of the system under investigation. The primary result of such dc measurements is the voltage-charge relation. Additionally, the reciprocal of the first derivative of the voltage charge relation is frequently useful and is variously called the incremental or differential capacitance because this derivative has the units of an electrical capacitance. Both ac and dc techniques have been used to generate differential data. In the study of the electrode-electrolyte interface the "differential capacitance" is used as a probe of the double layers formed at such interfaces as described by E. Gileadi et al., supra. In this measurement an ac signal, or some other fast wave form, is applied to an electrochemical cell. The electrical capacitance is then measured and its derivative with respect to applied potential obtained. This differential capacitance refers to the electronic capacitance associated with the geometry of the electrode and the interfacial region and is not necessarily related to the near equilibrium capacity.

Another type of "differential capacity" curve is obtained from direct current data by differentiating the V vs. Q discharge curve. Such a technique results in the same derivative curve obtained in the present method if a constant current discharge at $I_{minimum}$ is performed. But such techniques which do not yield kinetic data, will require excessive time when constant current cycling is done and, in general, will not provide precise resolution of the derivative curve.

The current pulse technique is another dc technique that may provide complementary data to those obtained by a voltage stepping method. In this experiment a discharge is performed at constant current for a time and then the current is shut off (cell at open circuit) as shown in C. R. A. Clauss and H. E. L. G. Schwergart, J. Electrochem Soc., 123, 951 (1976). When the cell is at open circuit, the time dependent voltage is recorded to study cell kinetics and to extract non-equilibrium contributions to the cell voltage, principally the voltage drop across internal resistances (i.e., IR drop). This technique may be used to obtain the voltage-composition relation and the incremental capacity curve as shown by Clauss et al., supra (a typical coulometric titration) but is perhaps more typically used for kinetic measurements (See, for example, H. P. von Leenwen, Electrochemica Acta, 23, 207 (1978). The kinetic information obtained by current pulsing and potential stepping should be complementary in nature since the current pulse produces time-dependent potential data, taken under open circuit conditions, while the voltage step produces time-dependent current data, taken while the cell is being charged or discharged. The preferred method will depend somewhat on the boundary conditions applicable to a particular experiment, (e.g., E Gileadi et al., supra) particularly the cell impedance and capacity. The voltage stopping procedure may be preferred where large cell impedances are encountered. Also, the current pulse method forces the cell out of equilibrium conditions so that true thermodynamic parameters may be difficult to obtain.

Raleigh and Crowe (J. Electrochem Soc., 116, 40 (1969) and D. O. Raleigh (Prog. Sol. State Chem., 3 83 (1967)) have described an electrochemical measurement that resembles the methods of the present invention but does not include the novel features of the present method as hereinafter disclosed and claimed. In the method of Raleigh and Crowe and Raleigh, supra, kinetic studies were done by stepping the voltage and measuring the decay of the current that was generally proportional to $t^{-\frac{1}{2}}$ (semi-infinite, linear diffusion). Voltage stepping occurs after a measured time that is empirically determined to minimize the overlapping diffusion currents on successive steps, i.e. the constant voltage is maintained long enough so that the current at the end of each voltage step is small compared to the peak current on the next step. This measurement was primarily used for kinetic studies and hence did not include features specifically required for thermodynamic analyses.

The above-described references, in essence, teach the various dc techniques which involve measuring the cell voltage, current and integrated charge and the time dependence of these parameters.

A number of patents have issued describing methods for determining the status of batteries. Examples of these patents are:

| U.S. Pat. Nos. | Patentee(s) |
| --- | --- |
| 3,778,702 | Finger |
| 3,997,831 | Hopfner |
| 4,020,414 | Paredes |
| 4,024,523 | Arnold et al. |
| 4,053,824 | Dupuis et al. |
| 4,118,661 | Siekierski et al. |

The Finger and Hopfner patents show means for testing batteries over less than the full discharge range. Paredes teaches the monitoring of a battery in a step-by-step sequence in order to determine its status. Arnold et al. utilizes the slope of a terminal voltage transient, and a function of that transient during a test period is created, analyzed and evaluated against reference levels. Dupis et al. also utilizes transients for battery testing. Siebierski et al. in charging batteries, tests increments to determine the approach to an overload condition.

The above-mentioned patents do not teach the novel stepping procedure of the instant invention as hereinafter disclosed and claimed. The Paredes, Arnold et al., Dupis et al. and Siekierski et al. patents teach the utilization of a finite portion of the discharge or charge curve for testing purposes.

The prior art does not teach or disclose the instant method wherein many, quasi-open-circuit measurements are made to obtain a high resolution of the voltage at the expense of ideal thermodynamic results. When small voltage steps are made, the cell is never far from equilibrium conditions. By the method of the instant invention the cell kinetics may be determined throughout a voltage cycle by measuring the time dependent current. This measurement method should excel when high resolution data are required, particularly on cells of high impedance or on cells where large departures from equilibrium would produce slowly decaying surface inhomogeneities. It should be a preferred technique when the high resolution, simultaneous measurement of kinetic and thermodynamic data are desirable to identify electrochemical reaction mechanisms.

SUMMARY OF THE INVENTION

Generally speaking, the present invention relates to a method and devices for measuring electrical capacitance by sequentially stepping the voltage applied to a device having electrical capacitance and measuring the accumulated charge. More specifically, the invention relates to a method and devices for measuring the electrical capacitance of an electrochemical cell. The method involves applying a series of constant potential steps to an electrochemical cell. On each potential step the cell is permitted to attain quasi-open-circuit conditions by letting the current decay to a small, but finite, value. When small voltage steps are made, the voltage-charge relation obtained is a highly precise and accurate approximation to the thermodynamic properties of the cell.

The technique may be used to study the potential-dependent cell kinetics and thermodynamics, the thermodynamics of adsorption on surfaces, and the phase diagrams of electrode materials. These performance parameters are useful in the assessment of new battery systems.

The automatic battery cycler of the invention automatically performs several cycling operations and permits the collection of high precision data in a minimal time period. The apparatus has both constant current and constant potential cycling modes.

In the constant current mode a regulated power supply in the battery cycler maintains a constant current in the external circuit including the test cell. The direction of the current flow is chosen by the operator to initially charge or discharge the battery. As the battery is discharged (charged) the cell voltage drops (increases) until an operator-set voltage limit is reached. At this voltage limit an internal, digital voltage comparator is used to program a reversal of the current flow which then continues to the next point where reversal again occurs. In this manner repetitive cycles of the cell are made. Typical specifications of this mode are:

Current (a) Independently controlled for the charge and discharge cycles. For example, the current can be set to 1.0 mA on discharge and 2.0 mA on charge.

(b) The current is controlled from typically 10 $\mu$A to 100 mA.

Voltage Limits (a) Digitally controlled and set limits that may be set with a thumb wheel switch to values between 0.01 V and 9.99 V.

(b) Setability and reproducibility are better than 0.01 V.

Outputs (a) Digital and analogue outputs are provided for charge, current, and voltage and a time mark is provided.

(b) Current outputs are provided for the electrochemical cell and a separate voltage input to measure cell potential from a reference electrode.

The novel features incorporated in the constant current mode of the method of the invention are:

(a) Digital switching circuits that permit the extreme voltages to be set with precision and maintained with high stability.

(b) An 8 digit coulometer that permits the accurate, precise measurement of charge.

(c) Simultaneous output of electrical charge, current and cell voltage.

These novel features enable constant current battery cycling with long term reliability, stability and with data outputs needed to fully characterize the battery cycle.

BRIEF DESCRIPTION OF THE DRAWINGS

FIG. 10 is a graph of the electrochemical potential vs. the charge as expressed in moles of lithium in $Li_xTiS_2$. The data are those collected in accordance with Example III.

DETAILED DESCRIPTION OF THE INVENTION

The instant invention relates to a new method for measuring the electrical capacity of an electrochemical cell that involves sequentially stepping the voltage applied to the cell and measuring the accumulated charge, the time dependent current, the time and the cell temperature. The apparatus and method of the instant invention relates the above functions at a finite scale, and eliminates the previous requirement to draw the current to zero, then recharge the battery. Instead of cycling between a complete charge and a complete discharge, arbitrary upper and lower limits of cell voltage are chosen and cycling between such limits enables the study of the battery. The limits can be changed during the study to obtain a battery profile. The use of the voltage stepping procedure in both the charge and discharge branches of a cycle, and obtaining the average net charge accumulated on each voltage step partially eliminates errors which may be introduced by switching to new voltage levels at finite current.

Constant potential cycling was hitherto done "by hand" with direct operator control or programmed by a dedicated computer. In this mode of cycling the battery is initially in equilibrium with a battery cycler. The battery cycler is then adjusted to a new voltage level and maintained at that level. In response to this change in voltage the battery passes current into the external circuit until its own potential reaches that set on the cycler whereupon the current decays to zero. When the current of zero is reached a new voltage is set and the procedure is repeated. This type of discharge is very time consuming. For example, each voltage step in an organic electrolyte battery might take one or more days for completion.

Figure 1:
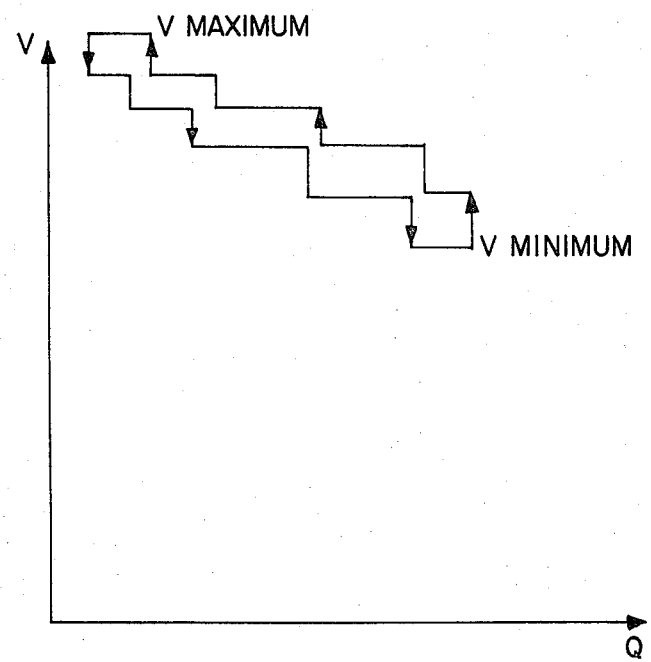
FIG. 1 is a schematic illustration of the voltage stepped cycling method.

An essential, novel feature of the battery cycler of the instant invention is that a very good approximation to the ideal, open circuit potential measurement may be made by not waiting for the zero current condition, but switching to a new voltage level at some small current level. Switching to new voltage levels at finite current introduces errors because the electrodes are not fully in equilibrium and because there will be voltage drops across the battery internal resistance and interfacial dipole layers. These errors can be partially eliminated by carrying out the voltage stepping procedure on both charge and discharge branches of a cycle and obtaining the average net charge accumulated on each voltage step. Specifically, a typical experiment is illustrated in FIG. 1 and involves the following sequence:

(a) the electrochemical cell to be tested is subjected to a low impedance, constant potential power supply a $V_{initial}$ and is allowed to reach equilibrium (or close to equilibrium);

(b) the power supply is then stepped to a lower (higher) value close to $V_{initial}$ and the cell discharges into (is charged by) the power supply until the current of the cell decays to $I_{minimum}$;

(c) the power supply to the cell is then stepped again when I is equal to $I_{minimum}$; and (d) the stepping continues until the cell voltage reaches a predetermined extreme value $V_{minimum}$ ($V_{maximum}$), whereupon the direction of voltage stepping is reversed as shown in FIG. 1.

The parenthetical manner of describing steps (a)-(d) is an abbreviated way of describing the cyclic nature of the process as shown in FIG. 1. Stated another way, the process of the invention, as described in FIG. 1, is as follows:

When voltage is applied to the cell via the power supply, current goes into the cell as long as the voltage in the cell is less than the voltage of the supply. If the voltage in the cell is greater than the power supply, the cell will discharge into the power supply. Thus, the cell either discharges into the power supply (when the voltage in the cell is greater than the power supply) or is charged by the power supply (when the voltage in the cell is less than the power supply).

The essential point of this mode of cycling is that a cycle is completed by a series of closely spaced (typically 1-100 mV) constant voltage steps and that the decision to make a step is made automatically when the cell current decays to a small value (typically 1 pico amp/cm$^2$ to about 10 mA/cm$^2$ current density).

The result of this sequence is a voltage cycle between the limits $V_{maximum}$ and $V_{minimum}$. The values of V (voltage) and Q (charge) in FIG. 1 at the switching points are equivalent to those that would be obtained on constant current cycling with a current of $I_{minimum}$. On each voltage plateau in FIG. 1 the appropriate averaged value of Q is shown at the midpoint between the charge and discharge steps. One advantage of taking data in steps is that much less time is required. At the start of each voltage step the current is large while at the end of the step $I_{minimum}$ is typically 1/100 of the initial value. Under such conditions a complete cycle of stepped data would take approximately 1/10 of the time required for constant current data. A complete cycle is made to test cell reversibility and to monitor hysteresis and irreversible contributions to the total accumulated charge. Taking the electrochemical data in stepwise fashion has several other advantages. The charge accumulated on each voltage step may be integrated from the measured current and yields an accurate derivative of the voltage-charge relation. Also, the time dependent charge and/or current can be measured on each step to extract kinetic information.

A principle feature of the method of the present invention is that the electrochemical cell is permitted to attain only quasi-open-circuit conditions with the minimum current value of $I_{minimum}$. This feature enables the operator to test a cell under conditions arbitrarily close to equilibrium conditions while at the same time enabling the operator to controllably sacrifice equilibrium conditions for speed of testing.

The present invention also relates to devices capable of performing the herein described method in a controlled and automatic manner. Generally, there are two classes of instruments of use in performing the battery cycling method of the invention. In the first, a device is built specifically for the battery cycling method of the invention with voltage, current, charge and time measurement capability, with power supplies designed to maintain a constant voltage and with logic circuitry designed to perform the voltage stepping procedure. In the second, a device is assembled from appropriate, commercially available or custom-made power supplies, current and voltage measuring instruments, clocks, thermometers, etc., and these devices are monitored and controlled by a digital computer or by a microprocessor. Automatic battery cyclers of the first type are particularly useful for routine, long-duration tests and can be operated by people with little training. The computer controlled system is more appropriate for detailed studies where the versatility of the computer operation is required.

The dedicated, automatic battery cyclers are described in detail below, but it will be understood that the invention is not to be construed as being limited to such equipment.

The automated equipment typically contains the following major components:

(a) a power supply means capable of providing a highly regulated dc voltage in the range of $-10$ volts to $+10$ volts and capable of being externally controlled by logic circuitry, a microprocessor or a computer. The resolution, stability and noise character of this power supply will determine the smallest possible voltage step that can be made by the equipment. For routine battery cycling the power supply should typically be capable of controlling the voltage with a resolution of 100 mV or less where all dc drift and noise components are below 1 mV and preferably below 0.1 mV. The power supply should have a long term stability of less than $\pm 10$ mV so that accurate calibration can be maintained. For more detailed studies a power supply having greater resolution may be required. Commercially available power supplies with a resolution of 0.25 mV have been found useful for detailed studies.

(b) A means for measuring the current through the electrochemical cell, typically a digital ammeter capable of measuring currents of 1 $\mu$A ($10^{-6}$A) and preferably currents of 1 pA ($10^{-12}$A). This ammeter should not unduly effect either the measured cell voltage or the current passing through the cell. To satisfy these requirements the ammeter should be of low input impedance such that the voltage drop across the ammeter is less than the resolution of the power supply at all current levels. Thus, for example, if the resolution of the power supply is 10 mV then the voltage drop across the ammeter should be less than 10 mV and preferably less than 1 mV. Then if the current is 1 $\mu$A, for example, the input resistance of the ammeter must be less than $R = V/I$ or $10^{-3}/10^{-6}$ or $1000\Omega$. Ammeters with such specifications are usually called "picoammeters" and are available commercially or may be constructed from component parts. The ammeter should have a suitable digital output so that it may be interfaced with the digital control instrument.

(c) A voltmeter capable of measuring the full voltage across the cell with a resolution appropriate for the size of the minimum voltage step and with digital output suitable for interfacing with the digital control circuitry. Such a voltmeter will typically be a digital panelmeter or multimeter having a full scale range of 1 to 10 V and a resolution of 0.1 to 10 mV. When small currents are measured ($I \simeq 1$ $\mu$A) the voltmeter will be additionally required to have a high input impedance, typically $10^{10}$ to $10^{15}\Omega$ and a small offset current, typically less than 10% of the value of $I_{minimum}$. The offset current herein described is that current that appears across the input terminals of the voltmeter. Many digital voltmeters have intrinsic offset currents of several microamps which would be unacceptable for these measurements so that care in selection of such meters is required or high input impedance amplifiers will be required to buffer the voltage measuring circuit. Techniques for fabricating such high impedance circuits are well known to those skilled in the art.

(d) A means for measuring the charge passed through the electrochemical cell. Several such devices are known to those skilled in the art. For example, the cell current may be passed through a sampling resistor and the voltage so developed across that resistor measured by a voltage to frequency converter. The voltage to frequency converter is a commercially available device that converts a measured voltage into a frequency whose magnitude is proportional to the measured voltage. The ac signal developed may then be counted through use of well known techniques to produce a total number of ac cycles. It will be recognized by those skilled in the art that this total number of cycles is proportional to the time integral of the cell current or the total charge passed through the cell.

Figure 2:
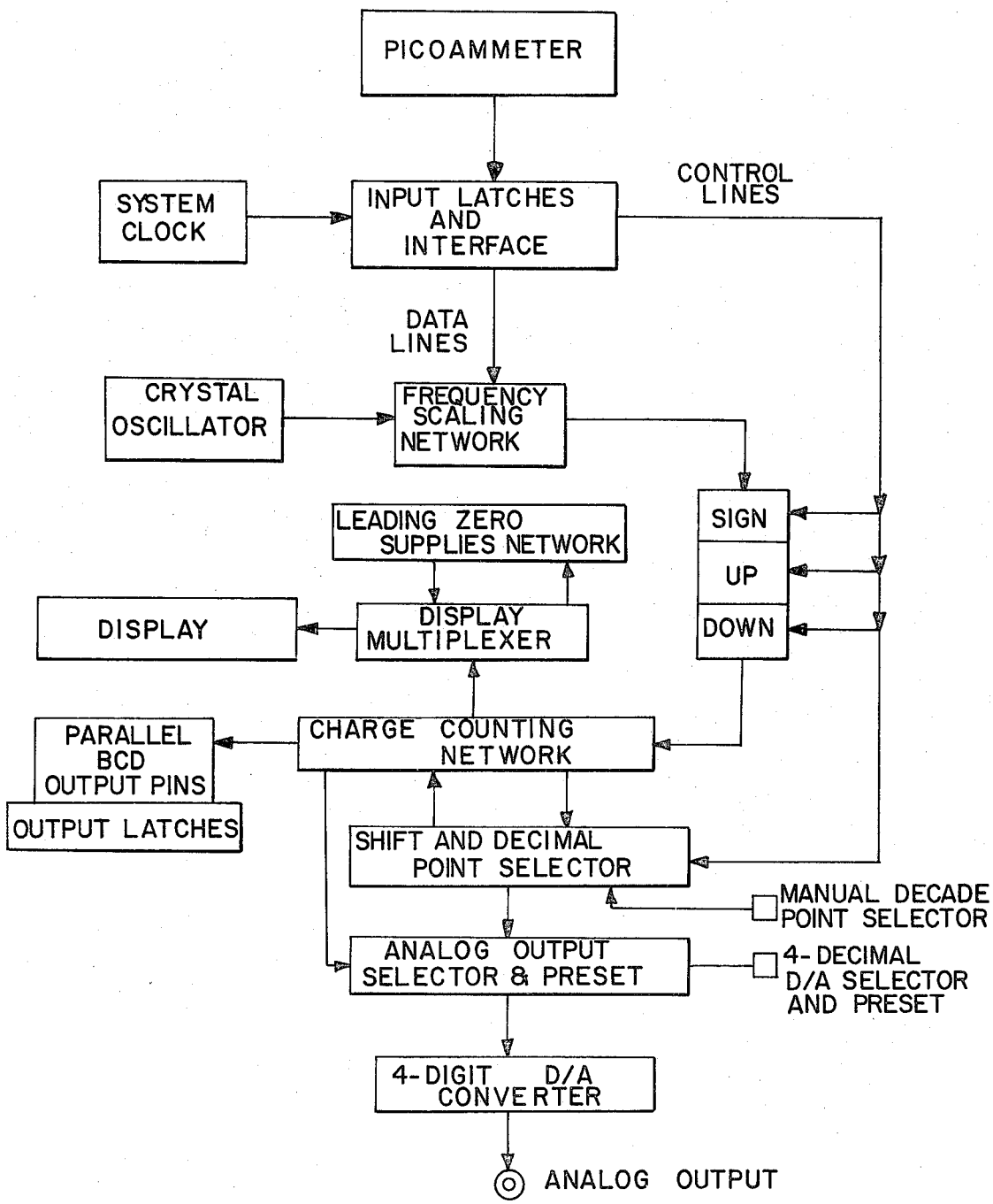
FIG. 2 is a block diagram of a coulometer based on the numerical integration of the output of a digital ammeter.
Figure 3:
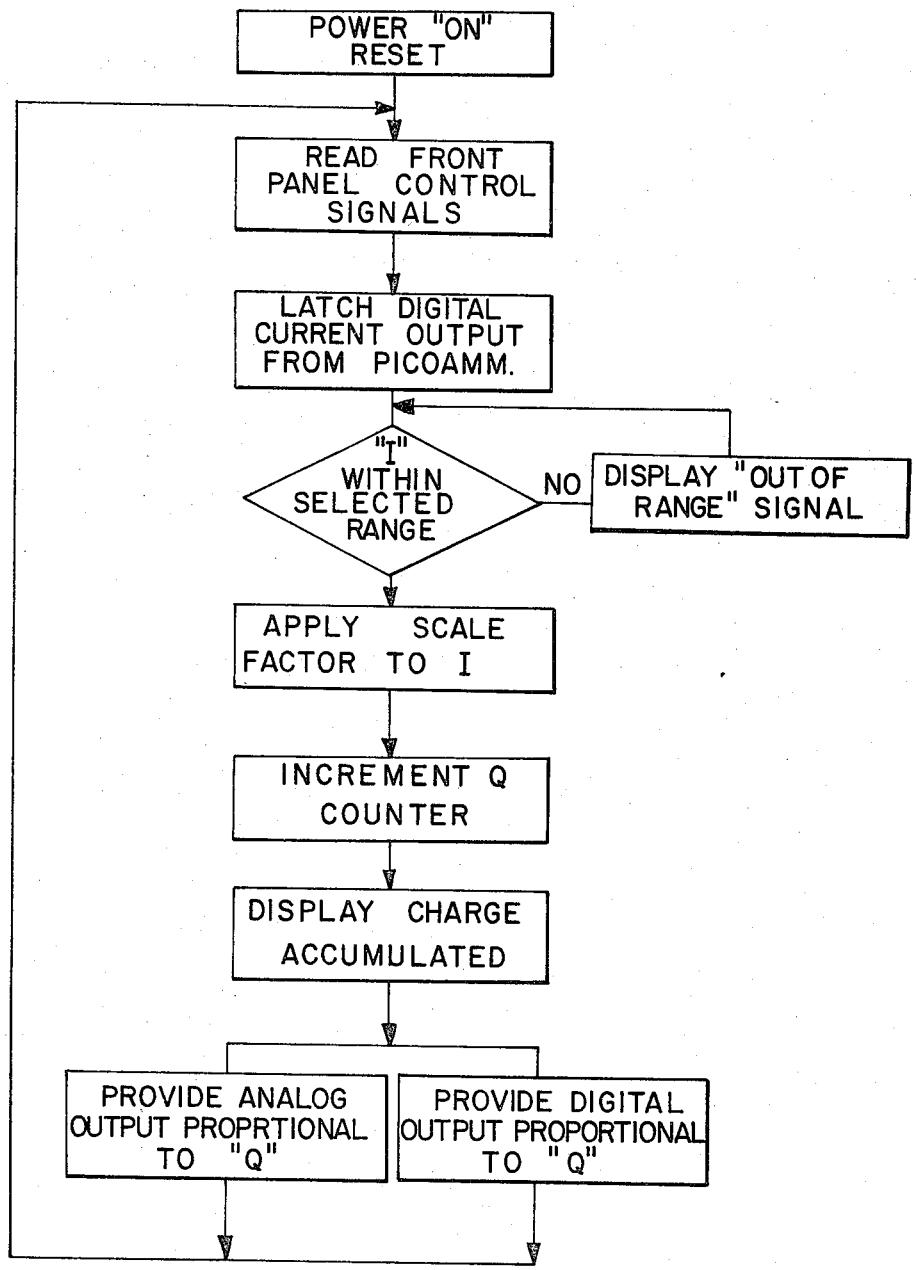
FIG. 3 is a flow chart of the operation of the embodiment of FIG. 2.

Alternatively, the digital output of the current measuring device may be digitally integrated. Such integration may be accomplished, for example, by repetitively measuring the current at fixed time intervals and then numerically summing these measurements to obtain the integrated charge. The appropriate time interval is determined by a crystal oscillator and frequency scaling network as shown in FIG. 2 and FIG. 3.

The charge measuring device or coulometer must be capable of integrating currents as small as $I_{minimum}$ with accuracy and precision. For typical routine measurements where $I_{minimum}$ is 1 $\mu$A and preferably less than 0.1 $\mu$A. For more sophisticated measurements on cells of high impedance or where near equilibrium conditions are needed $I_{minimum}$ may be 1 pA ($10^{-12}$A) and corresponding coulometer stability will be required.

Figure 4:
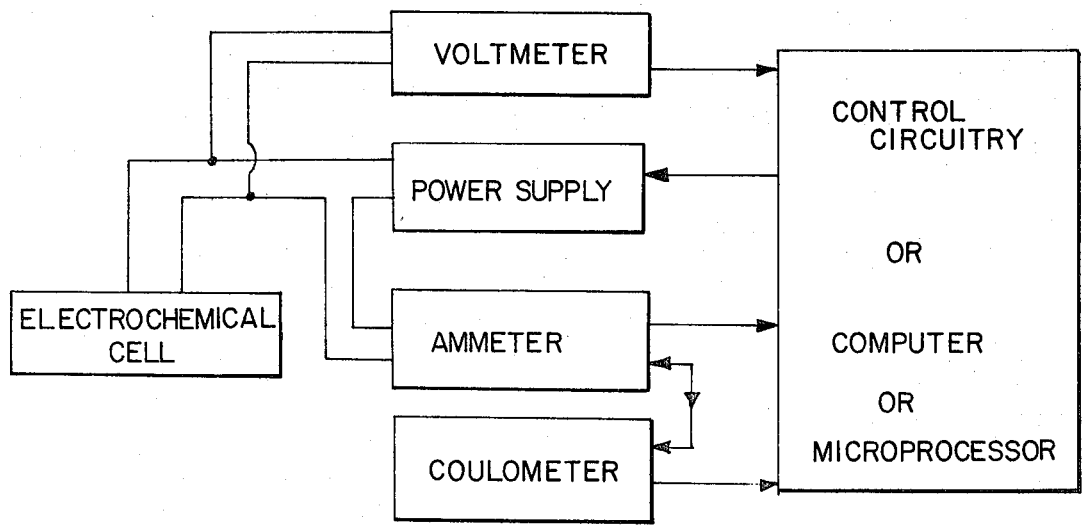
FIG. 4 is a block diagram of the general battery cycler illustrating the use of the major components and the interfacing to control circuitry.

The major system components, the power supply, the ammeter, the voltmeter and the coulometer are to be interfaced as shown schematically in FIG. 4. In a typical experiment the voltmeter measures the cell voltage, the control circuitry sets the power supply at that measured voltage and then initiates the programmed discharge-charge cycle. The control circuitry may most generally be hard wired logic circuitry, a preprogrammed microprocessor or a digital computer. Those skilled in the art will recognize that the computer or microprocessor may be programmed to perform any number of desired battery tests including the methods of the present invention. Computer controlled systems will not be further described, but it will be understood that such techniques are not meant to be excluded from the implementation of the methods of the present invention.

The implementation of the methods of the present invention by the use of logic circuitry will be illustrated in Example I.

The following examples serve to more fully describe the manner of making and using the above-described invention, as well as to set forth the best modes contemplated for carrying out various aspects of the invention. It is to be understood that these examples in no way serve to limit the true scope of this invention, but rather, are presented for illustrative purposes.

EXAMPLE I (Measuring Q by sampling resistor)

Figure 5:
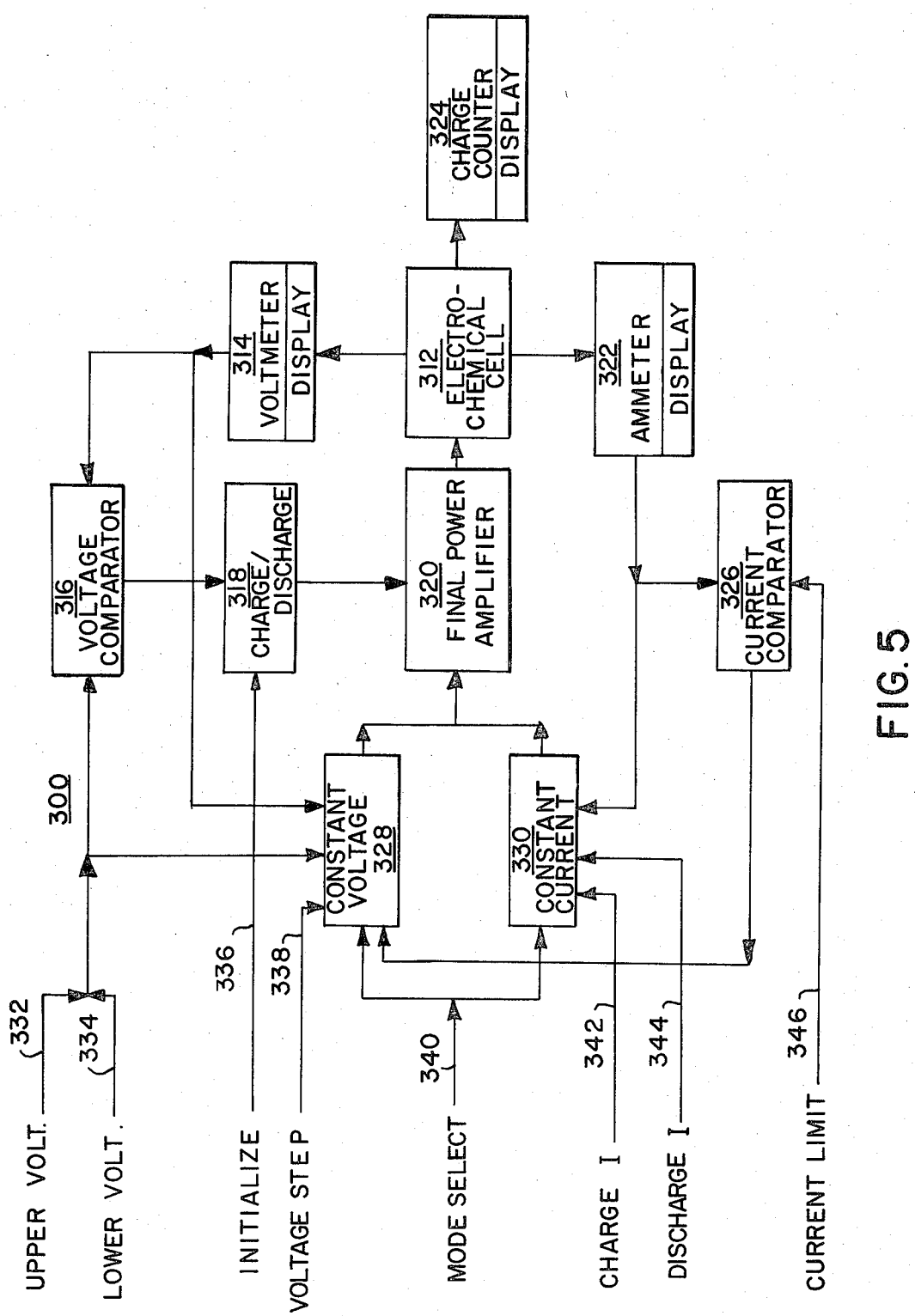
FIG. 5 is a block diagram of the circuitry comprising an embodiment of the invention as described in Example I.

Referring now to FIG. 5, a block diagram schematic of a preferred embodiment of the invention may be seen as designated generally by the numeral 300. Here, an electrochemical cell 312 is connected to a voltmeter and display 314 which measures the cell voltage. The voltmeter 314 is connected to the voltage comparator 316 which is operative to compare the voltage of cell 312 to a preselected upper and lower voltage limit. Also connected to the voltage comparator 316 is the charge/discharge selector 318 which is operative to select the direction of the voltage stepping from the final power amplifier 320. The final power amplifier 320 is further connected to the electrochemical cell 312 which is further connected to the ammeter 322 and the charge counter 324. The output of the ammeter 322 is further connected to the current comparator 326 which is operative to compare the measured current to the preselected current $I_{minimum}$ such that when $I_{measured} < I_{minimum}$ a switch signal is sent to the constant voltage power supply 328 which operates to step the voltage applied to the cell 312 through the final amplifier 320. The voltage comparator 316 and the current comparator 326 are digital voltage comparators that operate according to the principles as schematically illustrated in FIG. 9.

Figure 9:
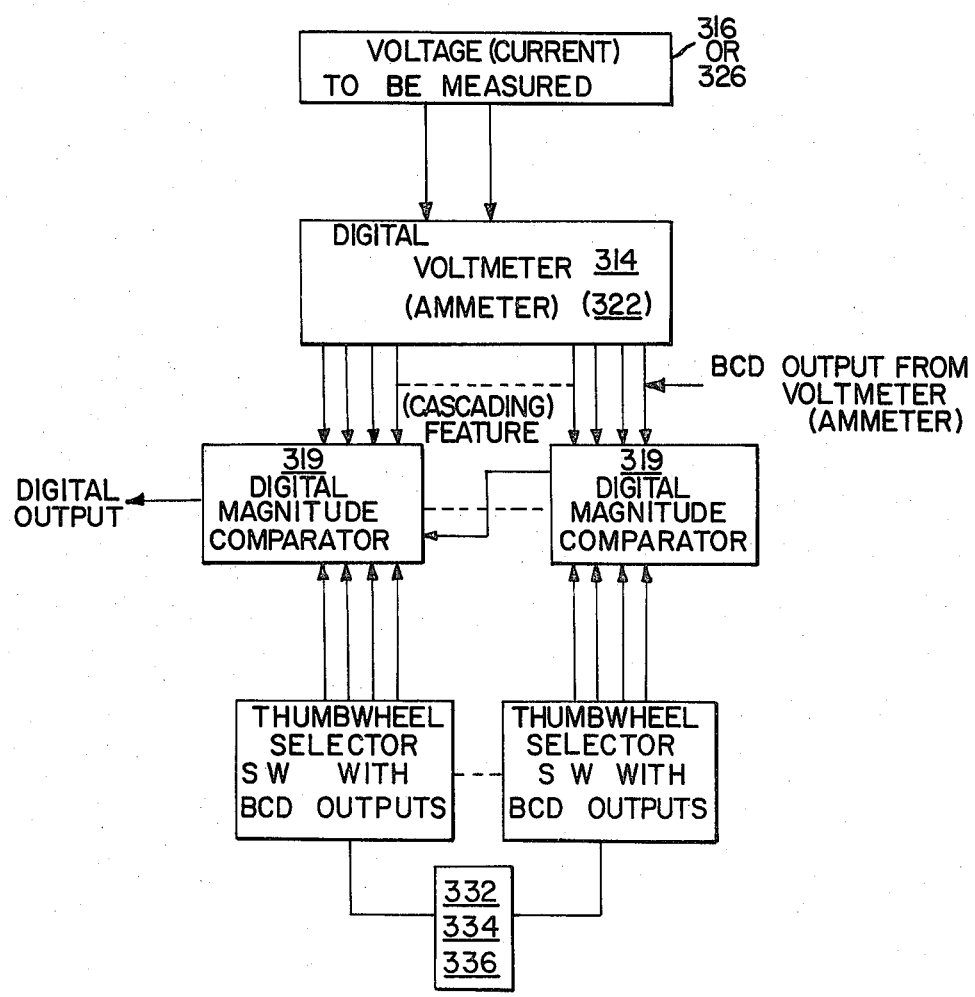
FIG. 9 is a block diagram of the circuitry of the voltage comparator as used in Examples I and II.

Referring to FIG. 9, an analog voltage signal proportional to the output of the cell 312 or an analog current signal proportional to the current through the cell 312 is applied to the input of the digital voltmeter 314 and digital ammeter 322, respectively. The analog-to-digital conversion that takes place in the internal circuitry of voltmeter 314 and ammeter 322 produces BCD outputs proportional to the input parameters. These digital output signals are further connected to one side of the BCD digital magnitude comparators 319 cascaded in a conventional manner to permit the connection of all the BCD signals at the output of voltmeter 314 and ammeter 322. The other side of the BCD magnitude comparators are further connected to the corresponding set of thumbwheel switches 332 for upper voltage limit; 334 for lower voltage limit and 346 for current limit. The setting of the thumbwheel switches corresponds to the function specified. The digital output of the magnitude comparator will be a logic "TRUE" when the magnitude of the voltage or current measured is equal to the numerical value set by means of the thumbwheel switches.

Referring again to FIG. 5, the voltage comparator 316 and the current comparator 326 are digital devices that operate on the digital input to the charge/discharge selector 318, the constant voltage power supply 328 and the constant current power supply 330 and receive digital input voltages from the thumbwheel switches for the upper voltage limit 332, the lower voltage limit 334 and the current limit 346. Additionally the charge/discharge selector 318 receives a manual initialize signal from the switch 336 that operates to establish the initial charge or discharge condition. The constant voltage power supply 328 further receives a voltage reference from the voltage step thumbwheel switch 338 which operates to select the size of the voltage step. The mode select switch 340 operates to select either constant voltage or constant current operation and the analogue potentiometers charge current 342 and discharge current 344 operate to control the value of the constant current output of the power supply 330.

The battery cycler as described in this example may operate in either the constant voltage mode where the methods of the present invention are implemented or in a constant current mode which is not included in the present invention. In the constant current mode the electrochemical cell is discharged at a constant current $I_{discharge}$ and then charged at a constant current $I_{charge}$ the charge and discharge being performed between the voltage limits $V_{maximum}$ and $V_{minimum}$ as set by the upper voltage switch 332 and the lower voltage switch 334. Constant current cycling is known to those skilled in the art and is not an embodiment of the instant invention but is included as a convenient extension of the circuits employed in the design of FIG. 5.

Figure 6:
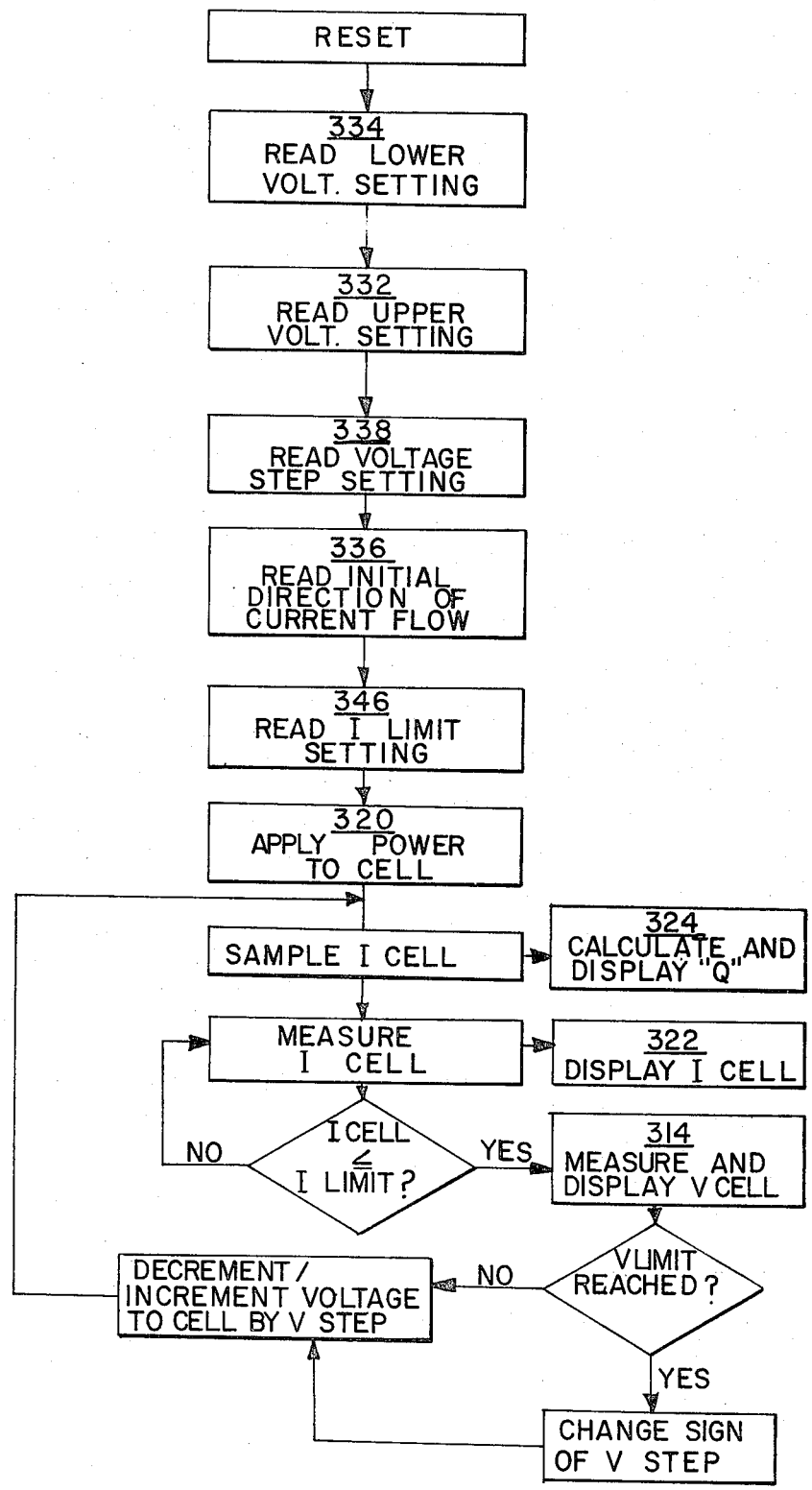
FIG. 6 is a flow chart of the operation of the embodiment of Example I.

The constant voltage operation of the battery cycler of FIG. 5 is further described by the flow chart schematic of FIG. 6. In FIG. 6, the initialize signal from switch 336 presets the electronic control circuit to its starting state. From this point on, all the parameters set by the front panel controls are continuously monitored and power is applied to the cell through the final power amplifier 320. The current through the cell is continuously sampled and integrated with respect to time to yield a numerical value for the charge in Coulombs delivered (or removed from) the cell 312. The value of the current passing through the cell 312 is measured by ammeter 322. This value is further compared with the preset value of $I_{limit}$ and when the cell current is equal or less than $I_{limit}$, the voltage applied to the cell is incremented (positive V step) or decremented (negative V step) depending on whether the cell is being charged or discharged. The decision to charge or discharge the cell at the beginning of the cycle is made with the appropriate command entered with switch 336, the cell is automatically transferred from a charging cycle to a discharging cycle as its terminal voltage reaches the upper voltage limit. In a similar manner, the cell will be switched from a discharging cycle to a charging cycle as its terminal voltage reaches the lower voltage limit.

EXAMPLE II

Figure 7:
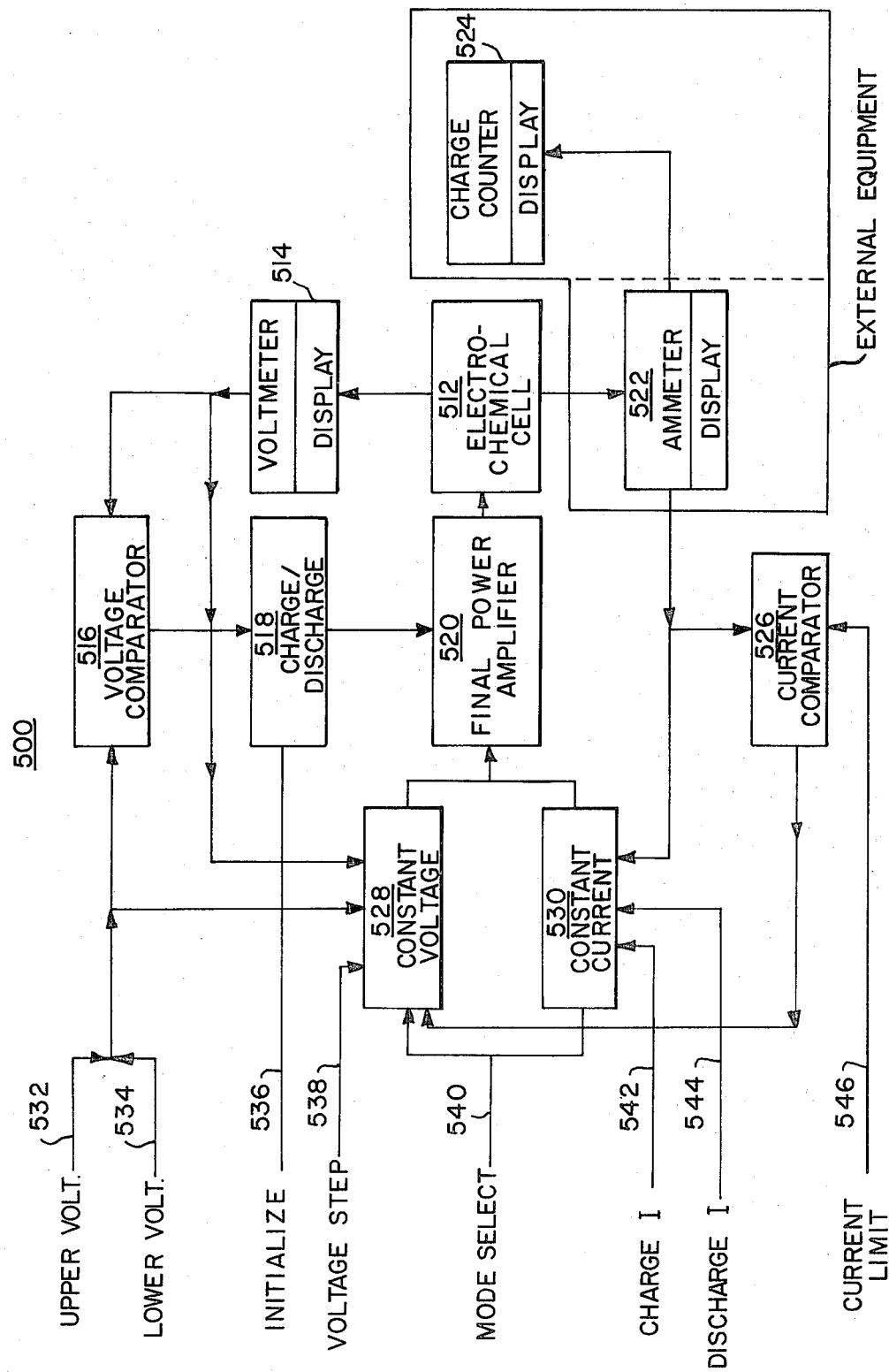
FIG. 7 is a block diagram of the operation of the embodiment of Example II.

Referring now to FIG. 7 a block diagram schematic of a second embodiment of the invention may be seen as designated generally by the numeral 500. The structure of this embodiment is quite similar to that of Example I with the corresponding circuit elements of FIG. 7 being designated by numerals increased by 200 over the corresponding elements in FIG. 5. The principle difference between the embodiments of Example I, FIG. 5 and Example II, FIG. 7 is that in FIG. 5 the charge is determined by a circuit that operates independently of the current measuring circuit while in FIG. 7 the charge is numerically integrated from the output of the ammeter as previously described in reference to FIG. 2 and FIG. 3. The choice of using Example I or Example II will be determined by the needs of the user as reflected in the cost and performance. Generally speaking, the embodiment of Example I will be less costly than that of Example II but the embodiment of Example II will offer higher stability with respect to long term drift in values because only digital circuitry is used in the measurement of the charge.

Figure 8:
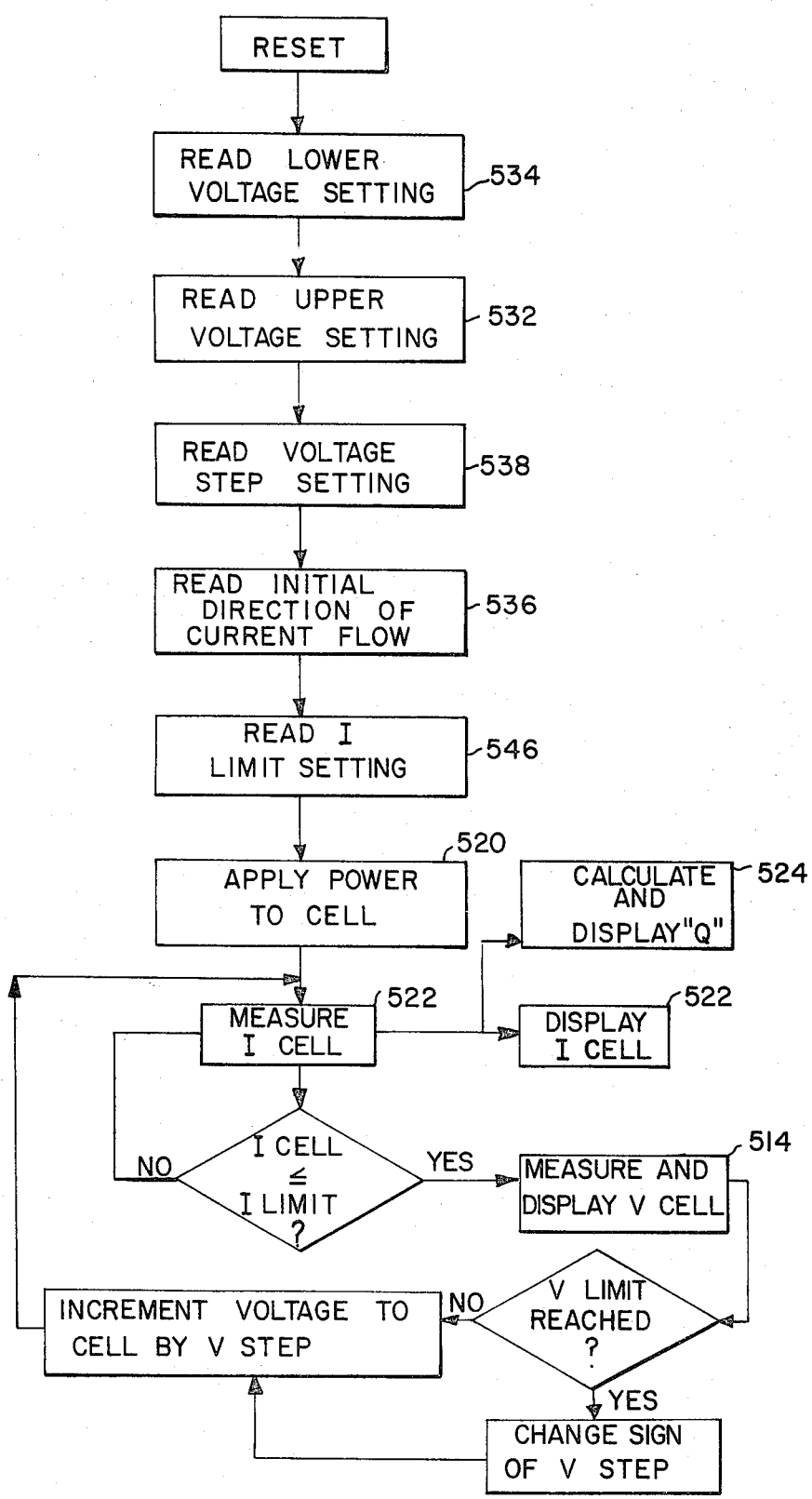
FIG. 8 is a flow chart of the operation of the embodiment of Example II.

The operation of the embodiment of Example II is further described by the flow diagram of FIG. 8. FIG. 8 is seen to be quite similar to FIG. 6 and the corresponding circuit elements of FIG. 8 are designated by numerials increased by 200 over the corresponding elements of FIG. 6.

The potential cycler of the present invention includes the following features:

(a) An 8 digit coulometer that permits the precise measurement of the charge accumulated on each voltage step.

(b) A digital logic circuit that automatically reverses the charge-discharge operations at the extreme voltages.

(c) A digital logic circuit that advances the voltage step when the current reaches some minimum set point. This set point can be determined in two ways:

(i) The current can be measured at every point in time and converted to an equivalent voltage. A voltage comparator can then be used to determine when the current decays to the set value.

(ii) The preferred implementation of determining the minimum current level is to monitor the digital coulometer. The digital coulometer is a voltage-to-frequency converter producing a frequency proportional to the voltage measured across a current measuring resistor. The current can be determined then by measuring the time required to pass a unit of charge. Alternatively, the condition that the current has fallen to a value below the set minimum will be observed when the unit of charge does not advance one unit in a specified time interval. For example, suppose one wishes to advance the voltage step when the current falls to a level of less than 1 $\mu$A and the resolution of the coulometer is $10^{-4}$ coulomb. Then when the current decays to a level less than 1 $\mu$A the coulometer will not advance one unit in 100 sec. This condition causes the voltage advance. This method has the following advantages:

(1) Charge and current are now converted to the time and frequency domains in which highly precise measurements can be made.

(2) When the least significant charge unit is monitored the full resolution of the instrument is used regardless of the setting of the minimum current.

(3) The current level is integrated over the time between sampling events (100 sec. in the example) this reducing the effects of noise on the current measurement.

(4) High sensitivity, low noise current measurement is not needed for the control functions.

(d) A current limiter that limits the current through the battery when the voltage is stepped.

(e) A digitally selected voltage step control that provides easily set, precise and repeatable setting of the voltage step size.

(f) Outputs of the current, charge, voltage and time in analogue and digital format.

EXAMPLE III

This example demonstrates the use of the methods and device of the instant invention in the study and analysis of a typical electrochemical cell such as described by Whittingham (*Science,* 192 1126 (1976)). An electrochemical cell was constructed of a cathode and an anode. The cathode comprised of TiS$_2$ as the electrochemically active material was hot pressed at 300° C. onto a stainless steel, expanded metal grid at 1000 pounds per square inch incorporating 10 weight percent Teflon powder as a bonder. (Graphite powder may be used as the conducting dilment to reduce the amount of active material on the grid). Typically 20 to 60 mg. of TiS$_2$ are loaded on a cathode of 2 cm$^2$ area. This cathode is then inserted in a porous separator bag (Webril nonwoven fabric from Kendall Company) and wrapped with a second separator of Celgard No. 2400 (available from Celanese Plastic Company). Finally, the cathode and separators (e.g., porous polyethylene sheet) are wrapped with the anode, comprised of lithium metal sheet, and immersed in an electrolyte comprised of one molar lithium perchlorate dissolved in dioxolane, i.e., the electrolyte is a dioxolane-lithium perchlorate. The cathode structure was wrapped first with the porous separator, whose function is to prevent electrical contact between the cathode and anode electrodes, and then the separators were wrapped with the lithium metal anode. Electrical contact was made to the anode and cathode by attaching copper clips to each electrode with wires attached to each cooper clip to make contact with the battery cycler. The cathode, anode, electrolyte, separator system was contained in a sealed polypropylene bag to contain the liquid electrolyte and prevent its evaporation. All cell preparation and testing was done in a high quality He-Ar dry box. All measurements used two electrodes with no reference electrode.

The cell constructed in the above manner was then connected to the battery cycler as described in Example I. The cycler controls were set so that the maximum voltage was 2.43 volts, the minimum voltage was 1.70 volts, the voltage step size was 0.01 volts and the minimum current level was 10 microamps. Cell temperatures were monitored during the measurements and maintained to be constant at ±0.25° C. Fluctuations in temperature occur over times that are short compared to the length of a voltage step (a voltage step is typically 2 hours) and no systematic errors in the charge measurement have been associated with temperature fluctuations.

The voltage and integrated charge data collected in this experiment are shown in FIG. 10. In FIG. 10 the charge is expressed as the number of moles of lithium in the compound Li$_x$TiS$_2$. The data in FIG. 10 represented by the dots are those taken by the voltage stepping technique and they are the integrated discharge curve of the cell at 300° K. The square data points are the true open circuit data from M.S. Whittingham, *J. Electrochem. Soc.* 123, 315 (1976). The data points (the dots) are those obtained at switching points when I=I$_{minimum}$ and are equivalent to a constant current discharge at the minimum current. For these measurements on TiS$_2$, I$_{minimum}$ was typically 1-5 $\mu$A/cm$^2$. In FIG. 10 there were deviations in the linearity of the V vs. Q plot. These deviations are more readily detected by making full use of the resolution of the measurement technique. On each voltage step the current is integrated to obtain the total accumulated charge. The measurement of this charge is reproducible to better than 1% of the charge accumulated on any voltage step. The full resolution is then obtained by plotting the "incremental capacity" vs. accumulated charge. The "incremental capacity" is the charge accumulated on each voltage step divided by the size of the voltage step.

Thus, it can be seen from the above description of the invention that the present method which uses many, quasi-open-circuit measurements to obtain high resolution of the voltage at the expanse of ideal thermodynamic results. When small voltage steps are made, the cell is never far from equilibrium conditions. The cell kinetics may be determined throughout a voltage cycle by measuring the time dependent current. While the method of the instant invention has been shown for the TiS$_2$-Li system, it is to be understood that it is applicable to a wide variety of electrochemical cells where high resolution data are required, particularly on cells of high impedance or on cells where large departures from equilibrium would produce slowly decaying surface inhomogeneities. By the method of the instant invention data can be collected in a derivative format that produces peaks in "intensity" (incremental capacity) at phase transitions in cell components and when two-phase products are formed. The method is then an "electrochemical potential spectroscopy" that defines the characteristic energies associated with phase change in an electrochemical system. The method provides high resolution, quasi-open-circuit data and complementary kinetic data throughout a complete voltage cycle.

What is claimed is:

1. A device for automatically testing an electrochemical cell, comprising:
    (a) means for selectively charging and discharging current to and from said cell in predetermined discrete steps responsive to control circuitry means;
    (b) means responsive to the current flowing from said cell, the output of which is capable of being interfaced with control circuitry means;
    (c) means responsive to the voltage across said cell, the output of which is capable of interfacing with control circuitry means;
    (d) means for measuring the current flowing through said means of paragraph (b) responsive to the current flowing from said cell, which is also capable of integrating said current and is further capable of being interfaced with control circuitry means;
    (e) control circuitry means coupled to said means of a paragraph (a), whereby said control circuitry means selectively controls the state of charge or discharge of current to and from said cell in response to said means of paragraph (c).

2. The device of claim 1 wherein said means of paragraph (a) is a power supply.

3. The device of claim 1 wherein said means of paragraph (b) is an ammeter.

4. The device of claim 1 wherein said means of paragraph (c) is a voltmeter.

5. The device of claim 1 wherein said means of paragraph (d) is a coulometer.

6. The device of claim 1 wherein said control circuitry means comprises a computer or microprocessor.

7. The device of claim 1 wherein said control circuitry means includes means responsive to the difference between the current of said cell and a reference current for determining the approach to thermodynamic equilibrium.

8. The device of claim 1 wherein the means of paragraph (d) comprises circuitry that is capable of numerically integrating the output of said means of paragraph (b) responsive to the current flowing from said cell.

9. The device of claim 1 wherein said means of paragraph (a) includes programming means operable by said control circuitry means of paragraph (e).

10. The device of claim 1 which additionally includes means for comparing the voltage across said cell with a reference voltage to thereby cause the current to be reversed when the voltage reaches a preset value.

11. A method for testing an electrochemical cell, comprising the sequential steps of:
    (a) supplying current to an electrochemical cell for charging said cell to a predetermined initial voltage (V$_{initial}$) of the cell and then allowing the current within the cell to approach or reach a predetermined level or thermodynamic equilibrium, said thermodynamic equilibrium being where the net current in said cell is zero;
    (b) then incrementally stepping the voltage to said cell at values that are either greater or lower than said V$_{initial}$ and allowing the current in said cell to decay to a predetermined current of the cell I$_{minimum}$;
    (c) repeating the procedure in step (b) until the voltage in said cell reaches a predetermined extreme value whereupon the direction of the incremental voltages and the cell current are reversed.

12. The method of claim 11 wherein in steps (b) and (c), each voltage step is spaced from about 1 to about 100 mV from each other.

13. The method of claim 11 wherein the decision to make a voltage step is made when the current in said cell decays to a value ranging from 1 pico amp/cm$^2$ to about 10 mA/cm$^2$ current density of the cell.

14. The method of claim 11 wherein a complete voltage charge and discharge cycle of the cell is made between a predetermined V$_{maximum}$ and V$_{minimum}$ of the cell under approximate open circuit conditions by letting the current decay to small, but finite values at each respective step and the values of the charge obtained during charging and discharging at a constant voltage and when I=I$_{minimum}$ are averaged to obtain approximate open circuit conditions.

15. The method of claim 11 wherein the cell is tested automatically by hard wired logic circuitry, a preprogrammed microprocessor or a digital computer.

16. The method of claim 11 wherein the constant voltage step may be changed at any value of the cell potential on either the charge or discharge cycle.

* * * * *